United States Patent [19]

Bartels

[11] Patent Number: 4,521,705
[45] Date of Patent: Jun. 4, 1985

[54] RELIABLE FIELD-EFFECT TRANSISTOR TIMER CIRCUIT

[75] Inventor: James I. Bartels, Hudson, Wis.

[73] Assignee: Honeywell Inc., Minneapolis, Minn.

[21] Appl. No.: 515,408

[22] Filed: Jul. 20, 1983

[51] Int. Cl.³ .................. H03K 17/284; H03K 17/687
[52] U.S. Cl. ...................................... 307/605; 307/108;
307/141.4; 307/246; 307/571; 307/252 R;
307/594; 307/296 A
[58] Field of Search ................ 307/96, 98, 108, 141.4,
307/200 B, 501, 240, 246, 571, 252 R, 252 A,
590, 592, 594, 599, 296 A, 603–605

[56] References Cited

U.S. PATENT DOCUMENTS

| 3,751,688 | 8/1973 | Hooghordel | 307/246 |
| 3,936,706 | 2/1976 | Hamstra | 307/246 X |
| 4,001,610 | 1/1977 | Griffin | 307/246 X |
| 4,158,149 | 6/1979 | Otofuji | 307/200 B X |
| 4,267,467 | 5/1981 | Tsukada | 307/246 X |
| 4,302,691 | 11/1981 | Kelley | 307/592 |

FOREIGN PATENT DOCUMENTS 0000856  1/1979  Japan .................................... 307/98

Primary Examiner—S. D. Miller
Assistant Examiner—D. R. Hudspeth
Attorney, Agent, or Firm—Alfred N. Feldman

[57] ABSTRACT

A positive voltage supply is connected to a circuit having a single capacitor and depletion-type field-effect transistor to create a reliable timer. The capacitor is initially charged upon the opening of a control switch without creating a timed output across the drain-source terminals of the field-effect transistor. The closing of the switch reverses the bias of the single capacitor to the gate-source connections of the field-effect transistor to thereby create a fixed and reliable timed interval.

9 Claims, 2 Drawing Figures

RELIABLE FIELD-EFFECT TRANSISTOR TIMER CIRCUIT

BACKGROUND OF THE INVENTION

The use of charge storage means or capacitors in conjunction with electronic circuitry for timing functions is well-known.

In many flame safeguard or burner control applications, timers are used for various timing functions such as prepurge, trial for ignition, ignition, etc. A malfunctioning timer or timing out of proper sequence in this type of an application can provide a time interval which will create a major safety hazard and potentially an explosion at the fuel burner. A means of safestart check is required in these applications to assure the proper output state of all times at the start of each burner cycle. However, a safe start check along does not assure that a timer will not operate out of sequence later in the operation cycle. As such, capacitive operated timers require extensive safety circuitry in these applications.

SUMMARY OF THE INVENTION

The present invention is directed to a very reliable type of timing circuit that is adapted to be driven or operated from a direct current voltage source. The timer utilizes a single capacitor and a depletion mode field-effect transistor means. An output voltage is obtained across the drain-source connections of the field-effect transistor when the transistor is biased out of conduction. The bias potential is provided from a single capacitor after the capacitor has been charged. The charge is transferred to the gate of the field-effect transistor by reversing the connection of the capacitor to provide a discharge path that biases the field-effect transistor to cut-off for a fixed timing interval based on the charge stored in the capacitor or charge storage means. Due to the dynamic requirements of the charge transfer means (open for arming, closed for timing), the likelihood of improper sequencing of timers is greatly reduced.

In accordance with the present invention, there is also provided a reliable timer circuit adapted to be connected to a source of direct current voltage, including: charge storage means and impedance means connected in a first series circuit to said direct current voltage source to cause a current flow and to in turn cause a charge to be stored in said charge storage means; depletion mode field-effect transistor means having a drain connection, a source connection, and a gate connection with said drain and source connections arranged in a second series circuit; said gate connection connected to said impedance means; said second series circuit further including second impedance means with said second series circuit connected to said direct current voltage source; said field-effect transistor drain and source connections forming an output circuit for said timer circuit; and switch means including connection means connected to said charge storage means with said switch means being conductive to discharge said charge storage means to bias said field-effect transistor means to a non-conductive state for a fixed interval of time; said non-conductive state of said field-effect transistor means providing said output circuit with an output voltage for said fixed interval of time.

DESCRIPTION OF THE PREFERRED EMBODIMENTS

Figure 1:
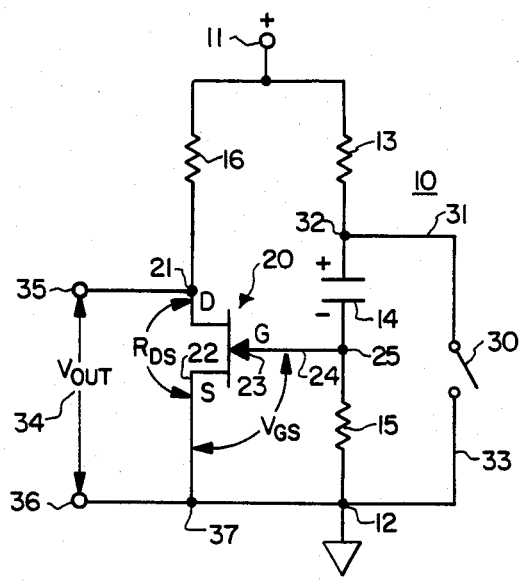
FIG. 1 is a schematic of a simplified timer circuit.

The disclosure in FIG. 1 is of a reliable timer circuit 10 that is adapted to be connected to a source of direct current potential between a positive terminal 11 and a ground 12. The positive terminal 11 is connected to a resistor 13, a capacitor or charge storage means 14, and a further resistor 15. The resistors 13 and 15 can basically be any type of impedance means, and it will be clear that resistors 13 and 15 along with the capacitor 14 form a first series circuit that is connected to the direct current voltage source 11.

The direct current voltage source 11 is further connected through an impedance or a resistor 16 to a depletion mode field-effect transistor means generally disclosed at 20 as a junction-type of field-effect transistor. The field-effect transistor means 20 includes a drain connection (D) 21, a source connection (S) 22, and a gate connection (G) 23. The impedance or resistor 16 along with the drain 21-source 22 circuit form a second series circuit that is connected from the source of potential 11 to the ground 12. This circuit is in parallel with the first-mentioned series circuit which includes the capacitor 14. The gate connection 23 is connected by a conductor 24 to a node 25 between the capacitor 14 and the resistor 15. As is well-known, the conduction of current in the drain-source circuit of the field-effect transistor 20 is controlled by a voltage $V_{GS}$ that occurs between the gate connection 23 and the source connection 22.

The timer circuit 10 is controlled in operation by a switch means 30 that is connected by a conductor 31 to a node 32 between the capacitor 14 and the impedance or resistor 13, and by conductor 33 to the ground 12. The switch means 30 can be any type of switch means such as a solid state switch means, a conventional switch, or a latching switch The circuit is completed by providing a voltage output $V_{out}$ 34 that occurs between two terminals 35 and 36 which are extensions of the drain connection 21 and the source connection 22 (which is grounded at a node 37).

Figure 2:
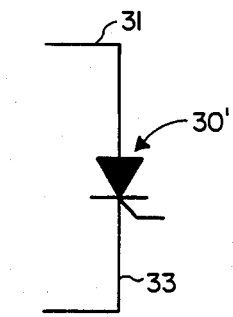
FIG. 2 is a latching switch alternative.

Before the operation of the circuit is discussed, an alternative switch means 30' is disclosed in FIG. 2. In FIG. 2, an alternative switch means 30' is disclosed connected between the conductors 31 and 33. The switch means 30' is a silicon controlled rectifier and is one form of latched switch. By latched switch, reference is made to a switch which, once closed, continues to conduct until some other event causes the switch to become open-circuited. As is well-known, a silicon controlled rectifier conducts once it is driven into conduction until the potential between the anode and cathode is removed. As such, the switch means 30' acts as a latched switch, but the switch 30' could be replaced by any form of latched switch, whether in solid state technology or in a mechanical switch structure.

The timer 10 of the present invention uses any type of depletion mode field-effect transistor means which has been specifically disclosed at 20 as a junction-type of field-effect transistor operating in the depletion mode. The drain-source resistance $R_{DS}$ is very large when a negative voltage is applied from the gate 23 to source $V_{GS}$. It will be noted that the negative voltage, $V_{GS}$, is derived from a single positive power supply or voltage source 11. The trigger circuit for the timer circuit 10 is the switch 30 which must operate dynamically in order for the timer to operate. This is a safety feature to assure that the timer does not operate out of sequence when used in conjunction with other timing circuits. This also allows a check on the dynamic operation of the switch 30, and prevents recycling of the timer 10 if the switch means 30 is of a latching type, such as disclosed in FIG. 2 at 30'.

CIRCUIT OPERATION

When power is first applied across the terminals 11 and 12, if the switch 30 is closed and the capacitor 14 discharged, the voltage $V_{GS}$ between the gate 23 and the source 22 will equal zero volts. If this is the case, the field-effect transistor means 20 is in the "on" state. The voltage $V_{out}$ between the terminals 35 and 36 is therefore low (grounded).

When the switch 30 opens, the timer 10 enters the "arming" mode. The capacitor 14 charges with a polarity as shown. The voltage, $V_{GS}$, is positive, and the field-effect transistor 20 remains "on," and the voltage $V_{out}$ remains low. To initiate the timing mode, the switch 30 is closed. With the closing of switch 30, the capacitor 14 discharges through the conductors 31 and 33, along with the resistor 15. The entire voltage of the capacitor 14 is effectively applied across the gate-source junction of the field-effect transistor means 20, but at a negative polarity wherein $V_{GS}$ equals a negative value. The negative $V_{GS}$ turns "off" the field-effect transistor means 20, and the output voltage between the terminals 35 and 36 or $V_{out}$ rises towards the positive potential at terminal 11. The time duration of the output voltage being high between the terminals 35 and 36 is a function of the discharge time of the capacitor 14 through the resistor 15, and of the pinch-off voltage of the field-effect transistor means 20. When the voltage on the capacitor has discharged below the voltage necessary to keep the field-effect transistor means 20 out of conduction, the voltage output at terminals 35 and 36 is again pulled low through the field-effect transistor means 20.

The switch 30 must remain closed for the entire timing period. In order for the timer to be re-armed, the switch 30 must open again to allow the charging of the capacitor 14. By making the switch 30 a latching-type of switch as is shown in FIG. 2 where the switch is shown as a silicon controlled rectifier 30', the timer can be locked out after one timing cycle.

The timer circuit 10 disclosed is a highly simplified form of a reliable timer utilizing a single capacitor. It will be noted that the negative voltage necessary to derive the timing function is in turn derived from a positive power supply. Also, the trigger circuit or switch 30 must operate dynamically in order for the timer to operate. These two safety features make the timer circuit 10 particularly useful in critical applications as are found in flame safeguard and burner control equipment. The circuit has been shown in a simplified form for convenience of description, and it is quite obvious that a number of variations in the circuit components could be made without departing from the scope of the invention. The applicant wishes to be limited in the scope of his invention solely by the scope of the appended claims.

The embodiments of the invention in which an exclusive property or right is claimed are defined as follows:

1. A reliable timer circuit for connection to a source of direct current voltage, including: charge storage means and impedance means connected in a first series circuit to said direct current voltage source to cause a current flow and to in turn cause a charge to be stored in said charge storage means; depletion mode field-effect transistor means having a drain connection, a source connection, and a gate connection with said drain and source connections coupled in a second series circuit; said gate connection connected to said impedance means; said second series circuit further including second impedance means with said second series circuit connected to said direct current voltage source; said field-effect transistor drain and source connections forming an output circuit for said timer circuit; and switch means including connection means connected to said charge storage means with said switch means being conductive to discharge said charge storage means to bias said field-effect transistor means to a non-conductive state for a fixed interval of time; said non-conductive state of said field-effect transistor means providing said output circuit with an output voltage for said fixed interval of time.

2. A reliable timer circuit as described in claim 1 wherein said charge storage means is a capacitor.

3. A reliable timer circuit as described in claim 2 wherein said impedance means are resistors.

4. A reliable timer circuit as described in claim 3 wherein said field-effect transistor means is a junction-type field-effect transistor.

5. A reliable timer circuit as described in claim 2 wherein said switch means is a solid state switch means.

6. A reliable timer circuit as described in claim 5 wherein said solid state switch means is a silicon controlled rectifier.

7. A reliable timer circuit as described in claim 2 wherein said switch means is a latching type of switch.

8. A reliable timer circuit as described in claim 5 wherein said impedance means are resistors; and said field-effect transistor means is a junction-type field-effect transistor.

9. A reliable timer circuit as described in claim 7 wherein said impedance means are resistors; and said field-effect transistor means is a junction-type of field-effect transistor.

* * * * *